United States Patent
Menon et al.

(10) Patent No.: US 7,915,935 B1
(45) Date of Patent: Mar. 29, 2011

(54) COMMUNICATION SYSTEMS W/COUNTER-BASED FREQUENCY CENTERING FOR MM-WAVE FREQUENCY BANDS

(75) Inventors: Gaurav Menon, San Diego, CA (US); Nitin Jain, San Diego, CA (US); Fnu Rajanish, San Diego, CA (US)

(73) Assignee: Anokiwave, Inc., San Diego, CA (US)

( * ) Notice: Subject to any disclaimer, the term of this patent is extended or adjusted under 35 U.S.C. 154(b) by 0 days.

(21) Appl. No.: 12/618,109

(22) Filed: Nov. 13, 2009

(51) Int. Cl.
*H03L 7/06* (2006.01)
(52) U.S. Cl. .......................................... 327/159; 455/75
(58) Field of Classification Search ........................... None
See application file for complete search history.

(56) References Cited

U.S. PATENT DOCUMENTS 6,112,059 A * 8/2000 Schwent et al. ........... 455/67.11

* cited by examiner

*Primary Examiner* — Cassandra Cox

(57) ABSTRACT

A low-cost and power-efficient communication system using digital frequency centering techniques suitable for millimeter-wave wide-bandwidth bands with mostly digital components. Significant circuitry in the frequency source can be switched-off, thus conserving power. With the use of non-coherent detection, power consumption can be further reduced as higher phase noise and lower frequency accuracy can be tolerated. In the first embodiment frequency centering is achieved with a multiple-state system which compares a frequency dependent unique state to a programmed or hard-wired desired state. In an alternative embodiment this multiple-state system is implemented by means of a microcontroller through either software or hardware.

25 Claims, 9 Drawing Sheets

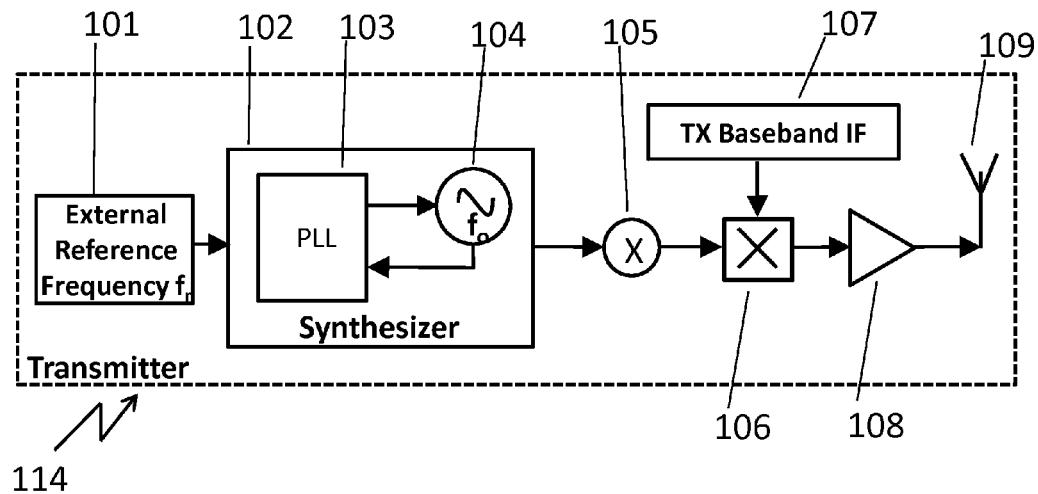
Figure 1A - Prior Art
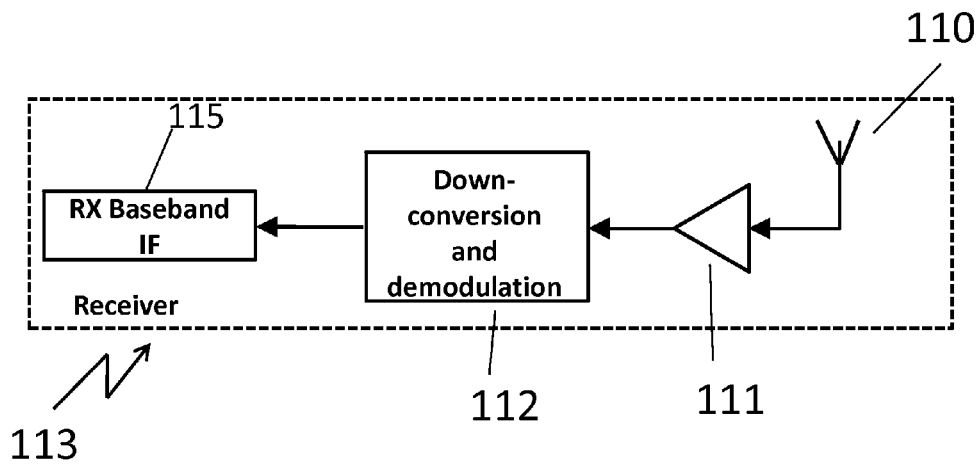
Figure 1B – Prior Art

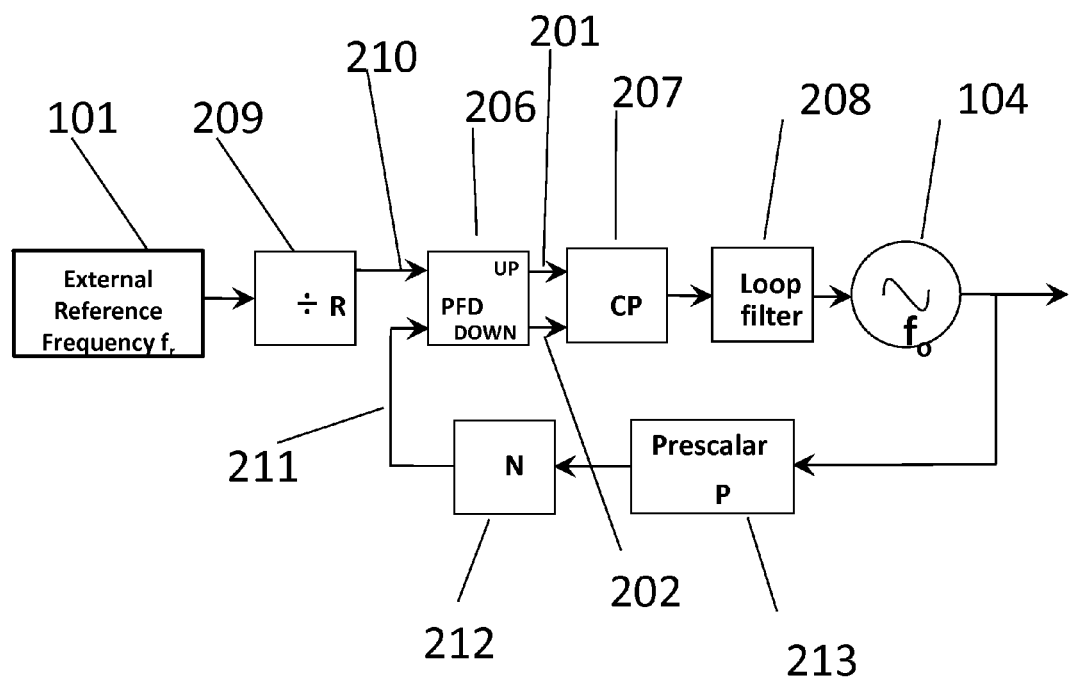
Figure 2 – Prior Art

OOK Detector

DPSK Detector

COMMUNICATION SYSTEMS W/COUNTER-BASED FREQUENCY CENTERING FOR MM-WAVE FREQUENCY BANDS

BACKGROUND

Prior Art

A number of communication systems are being developed for millimeter-wave (mm-wave) frequency bands. These mm-wave bands typically lie between frequencies of 20-130 GHz. The mm-wave systems of particular relevance in the 22-to-29 GHz band (referred as the 24 GHz band), the 57-66 GHz band (60 GHz band), the 76-81 GHz band (79 GHz band) and the 100-130 GHz band (120 GHz band). The 24 and 79 GHz bands are used in sensing applications such as automotive radar. The 60 GHz and 120 GHz bands are proposed for short-range, high-data-rate communication. These systems are primarily being developed for commercial applications, such as personal-area-network for mobile phones, where low cost is critical. In this document, all of these bands are collectively referred as millimeter-wave wide-bandwidth bands (MMWWBB). Systems that use MMWWBB require synthesizers for frequency generation. We first discuss typical communication systems used for communication in MMW-WBB.

FIGS. 1A 1B show a communication system comprising a transmitter 114 that transmits a signal and a receiver 113 that receives the signal. The transmitter further comprises a synthesizer or frequency source 102 that generate a signal which can be up converted by a frequency multiplier 105. The output signal from a multiplier 105 is modulated using transmitter (TX) baseband intermediate frequency (IF) input signal 107 by modulator 106 which could comprise of a mixer. A power amplifier 108 is used to amplify the signal from modulator 106 and goes to an output antenna 109 utilized to radiate the modulated signal. Synthesizer 102 includes a voltage controlled oscillator (VCO) 104 whose frequency is changeable by a voltage input, and a phase locked loop (PLL) 103 that is used to lock the frequency to a particular value. The synthesizer typically requires an external frequency reference 101 which acts as reference to lock the VCO. A VCO frequency can change ±10% in response to changes in process, supply voltage, and temperature (PVT); therefore, synthesizers are necessary to keep VCOs operating at the desired frequency. Receiver 113, described in FIG. 1B, includes a receiving antenna 110 that receives signals, a front-end, low-noise amplifier (LNA) 111 used to noiselessly amplify the signal, and a down conversion and demodulation block 112 used to recover the receiver (RX) baseband Intermediate Frequency (IF) signal 115.

The output power requirement for short-range communication in the MMWWBB is about 10 mW. Since the output power is low, the output components, namely multiplier 105, modulator 106 and power amplifier 108, consume low amounts of power. The synthesizer, on the other hand, consumes significant power and also has higher cost because of its complexity. Therefore, there is a need to develop low-cost frequency sources that consume low power for MMWWBB communication systems.

FIG. 2 shows a typical implementation of the phase-locked loop used for a frequency source. A phase frequency detector (PFD) 206 is used to track the difference between phases and frequency and a charge pump (CP) 207 is utilized to generate current pulses to charge a loop filter 208. Together these components help generate a control voltage for VCO 104. Reference frequency block 101 comprises a crystal oscillator; its frequency can be further divided by an integer R using a divide-by reference counter 209. Phase frequency detector (PFD) 206 generates either an up signal on up signal control line 201 or down signal on down signal control line 202. One of these signals is triggered, depending upon the difference in phase of signals at positions 210 and 211. The high frequency VCO signal is divided by a high speed analog divider referred to as a Prescalar. The Prescalar scales the high frequency down to a lower frequency and is often followed by dividers or counters; and, is thus referred to as Prescalar. In FIG. 2, Prescalar 213 divides the VCO's frequency by an integer factor P. Further division is made by a digital divider 212. Charge pump 207 supplies current when the up signal is triggered and sinks (receives) current when the down signal is triggered. Low-pass loop filter 208 converts this current to a control voltage (Vtune), which is applied to the VCO. Vtune increases when charge pump 207 supplies current and decreases when it sinks current. Loop filter 208 can be either active or passive and can have multiple components depending upon the speed and bandwidth requirements.

This prior-art approach, when used in communication systems, has some disadvantages. Because reference frequency, fr, is usually low, typically less than 100 MHz, the loop filter components can be very large. As a result the loop filter is often implemented outside the chip. In this synthesizer, because of the nature of the circuit, the reference signal is always on. Thus, even after the PLL is locked, the reference circuit needs to be on. As a result the circuit that generates the reference signal continues to consume power. Therefore, traditional PLL based sources have higher power requirements.

Other digital source circuits are shown in U.S. Pat. Nos. 4,864,253 to Zwack (1988), 4,450,518 to Klee (1981) and 5,726,607 to Brede (1994). In such circuits a frequency measurement system is used to measure the oscillator frequency in a specific time interval. Several readings in an interval can be averaged to provide the estimate of the oscillation frequency. The digital equivalent of this measured frequency is compared to the digital equivalent of the desired frequency. This digital comparison results in an analog voltage which changes the frequency of the oscillator toward the desired frequency. These circuits have been primarily developed for clock recovery and synchronization.

Many present-day communication systems utilize very narrow bands that typically span less than 500 Mega Hertz (MHz). For such communication systems, the information being communicated must be included in very small bandwidths. As a result the carrier frequency is modulated using high modulation rates to encode as much information as possible. The carrier signal is modulated through amplitude, frequency, or phase modulation methods. In a typical communication system a combination of these three modulation schemes is utilized. As a result multiple bits are encoded for every hertz of bandwidth in a very precise modulation manner.

At the detector or demodulator the modulated signal is demodulated and the information recovered. Since the modulated signal is precise, the demodulation process requires accurate carrier information. In particular, the phase of the sources for the transmitter and the receiver are precisely correlated. Such systems are referred to as coherent systems because the phase of the source at the receiver and transmitter are synchronized. In addition, both the receiver and the transmitter sources have very precise frequencies; again identical to each other. This coherence between transmit and receive sources requires higher power consumption and more expensive components.

As mentioned, typical communication systems use modulation schemes which require phase coherence. This results in a stringent phase noise requirement which is typically unachievable through digital control.

ADVANTAGES

This specification outlines methods and concepts such that VCOs can be digitally controlled for communication systems in MMWWBBs. Accordingly one or more aspects of the present system have the following advantages: The communication system is made simpler, reducing the cost of each component. Further the synthesizer can be made using digital components and the demodulation is achieved through simple methods. Since the communication system requires inaccurate frequency control, a number of components can be switched off, reducing power requirements. This also eliminates reference-frequency-related spurious content from the transmitted output. Further advantages of various embodiments and aspects will be apparent from the ensuing description and drawings.

SUMMARY

In one embodiment, a communication system generates a unique state based upon the frequency from the voltage-controlled oscillator (VCO) and compares the unique state to a desired state after a specified time interval. From this comparison, coarse- and fine-tune signals are generated which control the VCO. Further the communication system uses a non-coherent detection method to recover the transmitted signal. Further, when the VCO frequency is centered, a significant portion of the circuitry can be turned off.

DRAWINGS

FIG. 1 is a block diagram of a typical transmitter and receiver used in prior-art communication systems.

FIG. 2 is a prior-art synthesizer using a PLL with a phase frequency detector, charge pump, and loop filter.

Figure 3A:
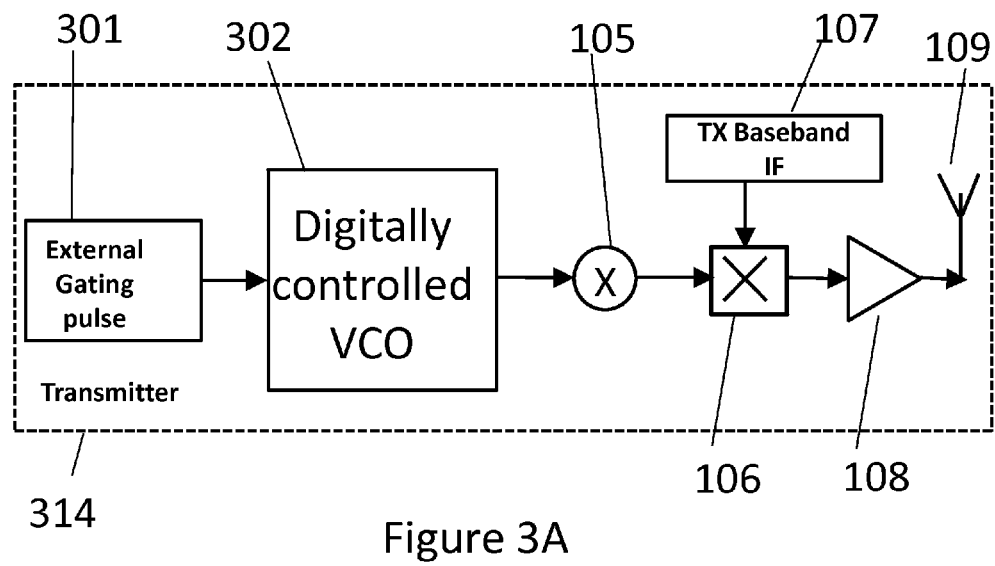
FIG. 3 is an embodiment of a communication system that has a digital controlled VCO with diode-detector for On-Off Keying (OOK) demodulation.

| REFRENCE NUMERALS | | |
|---|---|---|
| 101 | External reference frequency | |
| 102 | Synthesizer | |
| 103 | Phase locked loop (PLL) | |
| 104 | Voltage controlled oscillator (VCO) | |
| 105 | Multiplier | |
| 106 | Modulator | |
| 107 | TX baseband intermediate freq. (IF) | |
| 108 | Power amplifier | |

| REFRENCE NUMERALS | |
|---|---|
| 109 | Transmit antenna |
| 110 | Receive antenna |
| 111 | Low noise amplifier (LNA) |
| 112 | Down-conversion and demod. block |
| 113 | Receiver |
| 114 | Transmitter |
| 115 | RX baseband intermediate freq. (IF) |
| 201 | Up signal control line |
| 202 | Down signal control line |
| 206 | Phase frequency detector (PFD) |
| 207 | Charge pump (CP) |
| 208 | Loop filter |
| 209 | Divide by reference (R) counter |
| 210 | Divided reference signal |
| 211 | Divided VCO signal |
| 212 | Digital divider |
| 213 | Prescaler |
| 301 | External gating pulse generator |
| 302 | Digitally controlled VCO |
| 312 | Diode detectors for demodulating |
| 313 | Non-coherent receiver |
| 314 | transmitter w/digitally controlled VCO |
| 401 | Information signal |
| 402 | OOK modulation |
| 403 | another information signal |
| 404 | DPSK modulation |
| 405 | OOK waveforms |
| 406 | DPSK waveforms |
| 501 | diode detector for OOK signal |
| 502 | DPSK detector |
| 503 | delay line |
| 504 | voltage multiplier |
| 510 | rectifying diode |
| 511 | capacitor for filtering |
| 512 | resistor for filtering |
| 610 | Digital control circuit |
| 612 | AND logic gate |
| 613 | Coarse-tune logic |
| 614 | Fine tune DAC |
| 615 | analog voltage controlled osc. (VCO) |
| 618 | Divided VCO signal |
| 619 | input line for gating pulse |
| 620 | Delay circuit |
| 621 | Counter-logic circuit |
| 622 | Digital counter |
| 623 | Logic circuit |
| 624 | Buffer for SPI word |
| 642 | Coarse-tune signal |
| 643 | Fine tune signal line |
| 717 | Time interval Tint |
| 718 | Divided VCO signal |
| 719 | Gating pulse |
| 801 | multiple-state system with unique states |
| 804 | External control generating circuit |
| 805 | a set of control-signals |
| 806 | serial-programmable interface (SPI) |
| 807 | register |
| 901 | Dig. control ckt. for multiple VCO |
| 903 | Divide by M circuit |
| 904 | frequency source |
| 905 | multiple VCOs |
| 906 | control-signal for multiple VCO |

| ABBREVIATIONS | |
|---|---|
| DAC | Digital-to-Analog Converter |
| DPSK | Differential Phase Shift Keying |
| IF | Intermediate Frequency |
| LNA | Low-Noise Amplifier |
| MMWWBB | Millimeter-Wave Wide-Bandwidth Bands |
| N | Frequency divide number for counters |
| OOK | On-Off Keying |
| P | Frequency divide number for Prescalar |

| ABBREVIATIONS | |
|---|---|
| PFD | phase frequency detector |
| PLL | Phase Locked Loop |
| RX | Receiver |
| TX | Transmitter |
| VCO | Voltage-Controlled Oscillator |
| Vtune | Voltage used to Tune (for Oscillator) |

DETAILED DESCRIPTION

FIGS. 3A & 3B

Communication System with Digitally Controlled VCO and Diode Detector

The present embodiment is a communication system with a unique transmitter based on a counting system and that uses a non-coherent detector. Such systems are useful for high data rate communication, Radar systems and other two way radios. A non-coherent detector is one which the detector does not need a local reference to recover the transmitted signal. In this system the total power consumption is reduced and system achieves a lower overall cost.

Figure 3B:
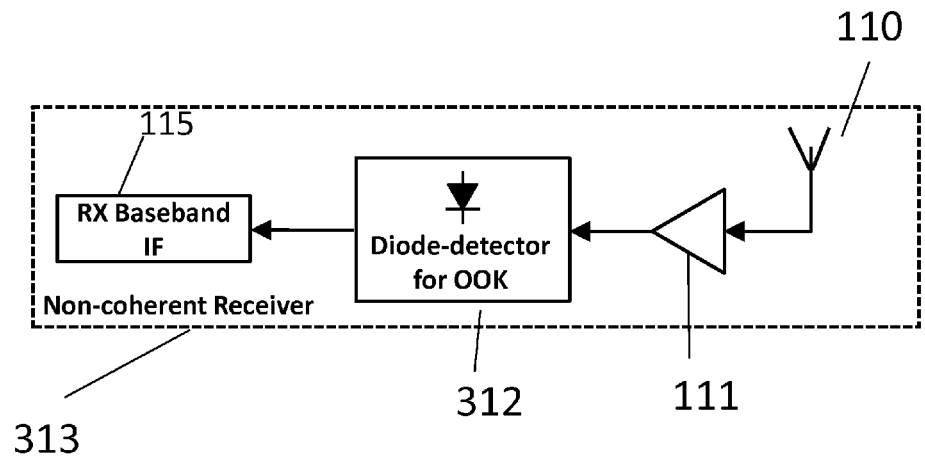

FIGS. 3A-B are block diagrams of one embodiment, a communication system comprising a transmitter with a digital controlled VCO in FIG. 3A and a non-coherent detector in FIG. 3B. The transmitter with the digitally controlled VCO 314 comprises an external gating pulse generator 301 for controlling a digitally controlled VCO 302 that generates a signal. The generated signal feeds an optional multiplier 105 which frequency multiplies the signal to a higher frequency. The higher frequency signal is fed into a modulator 106 that modulates the high frequency signal using a TX baseband intermediate frequency input 107. Finally a power amplifier 108 and an antenna 109 are used to transmit the signal.

A non-coherent receiver 313 comprises an input antenna 110, a low-noise amplifier 111, and a diode-detector 312 that is used to detect the IF signal. The digitally controlled VCO reduces power consumption and thereby lowers transmitter operating cost. The multiplied carrier is fed to modulator 106. In modulator 106 the carrier is modulated using a non-coherent modulation method, preferably on-off-keying (OOK). In OOK, as the name implies, the continuous signal from a signal generator is switched on-and-off. The receiver is designed to detect this non-coherent signal. This embodiment shows a diode detector method for detecting an OOK signal.

Thus, in this communication system, the digitally controlled VCO generates the carrier at a certain frequency and generates a continuous signal. Often since the VCO is difficult to design at mm-wave frequencies, the multiplier 105 is used to multiply the carrier signal to higher frequency. The information such as voice or digital bits is sent in through the baseband IF block and the modulator 106 utilized to create modulated signal. The modulated signal is then sent through an amplifier to the transmitting antenna. The receiver may contain a receiving LNA 111 and then the signal is converted to baseband IF via a diode-detector. The information is thus recovered. Note the system does not need a local reference at the receiver. The individual components shown in FIG. 3, and in all subsequent figures, are well-known in the art, as are their parameters and interconnections and thus will not be detailed.

FIGS. 4A & 4B

Modulation Schemes Used in Non-Coherent Communication Systems

Figure 4A:
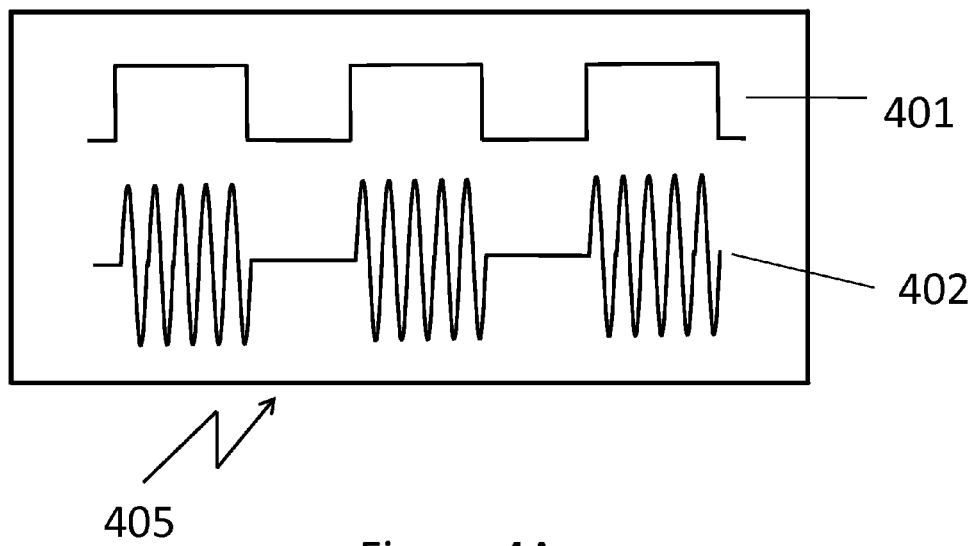
FIG. 4 depicts modulation waveforms for on-off keying and differential phase shift keying methods.
Figure 4B:
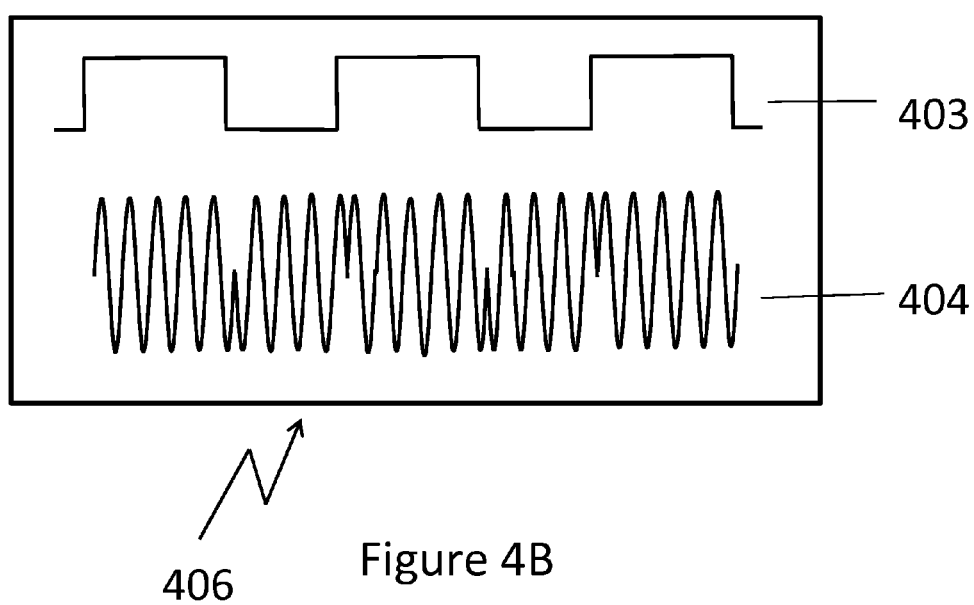

The OOK modulated signal allows non-coherent detection or demodulation. FIGS. 4A and 4B shows two examples of modulation signals that are usable for non-coherent detection; namely, an OOK arrangement 405 in FIG. 4A and a differential phase shift keying (DPSK) arrangement 406 in FIG. 4B, respectively. In DPSK instead of using bit pattern to set the phase of the wave, the bit pattern is used to change the phase by a specified amount. Since this scheme depends on the difference between successive phases, it is termed differential phase-shift keying (DPSK). Like OOK it does not need to have a copy of the referenced signal to recover the transmitted information.

An information signal 401 modulates the amplitude of the carrier wave, generating an OOK modulated signal 402. Similarly, another information signal 403 modulates the phase of the carrier wave, resulting in a DPSK modulated signal 404. These signals can be easily recovered using standard non-coherent detectors.

FIGS. 5A & 5B

OOK and DPSK Demodulators

Figure 5A:
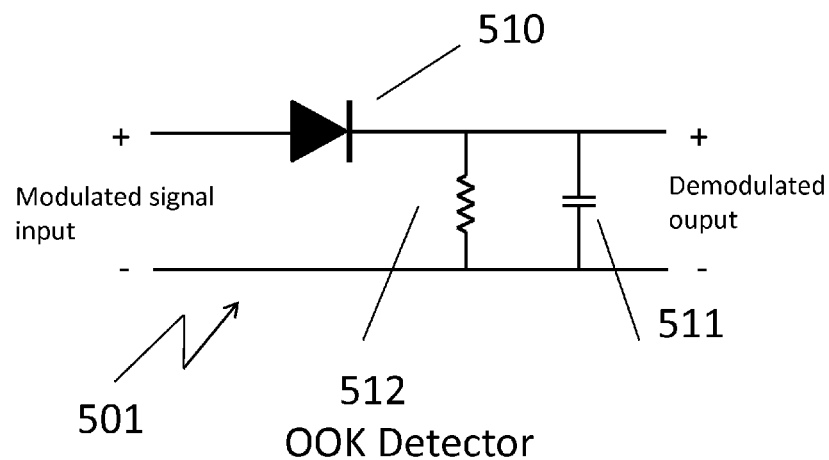
FIG. 5 depicts typical OOK and DPSK detectors used in demodulation.
Figure 5B:
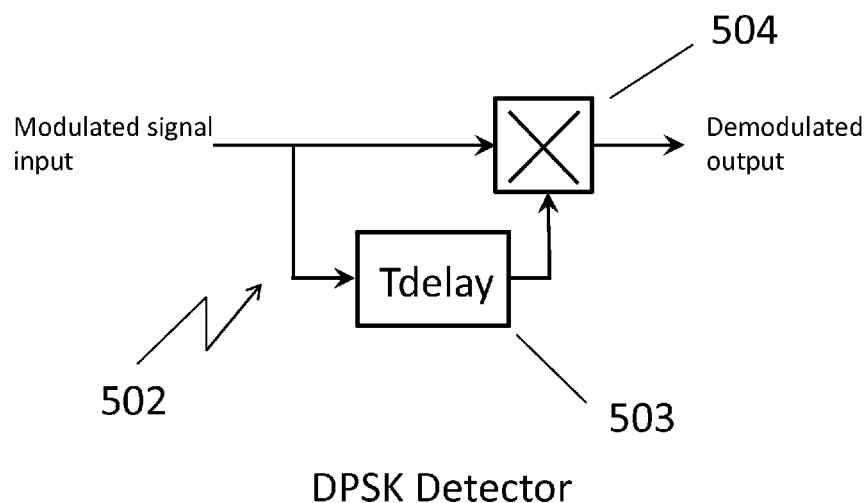

FIG. 5 shows a diode detector circuit 501 that can be used for detecting or demodulating the OOK signal, while circuit in 502 is DPSK detector used for demodulating DPSK signals. Diode detector circuit 501 is able to track the amplitude and depending on the amplitude it generates the digital bits. Rectifying diode 510 rectifies the signal, creating pulses that are filtered using a filtering resistor 512 and a filtering capacitor 511.

DPSK detector circuit 502, on the other hand, uses a voltage multiplier 504 for detection. The voltage multiplier has two input signals. The first input signal is the signal received by the receiver while the second input signal is a time-delayed replica of the first signal as a result of a delay in a time-delayer, Tdelay 503. Thus when there is a phase reversal, the two inputs to the voltage multiplier become out of phase. This results in a pulse with a duration equal to the delay in Tdelay 503 or about 1 ns for 1 Gbits/sec of information rate. Although only two non-coherent modulation and detection schemes are discussed, there are a number of other known non-coherent schemes that can be created using amplitude, frequency, and phase modulation. Examples include differential frequency shift keying, (DFSK), differential amplitude shift keying (DASK), and others. In addition to the non-coherent detection, the communication system of FIG. 3 also uses digital controlled VCO 302. Such a digitally controlled VCO will now be described.

FIG. 6

Digital Controlled VCO

Figure 6:
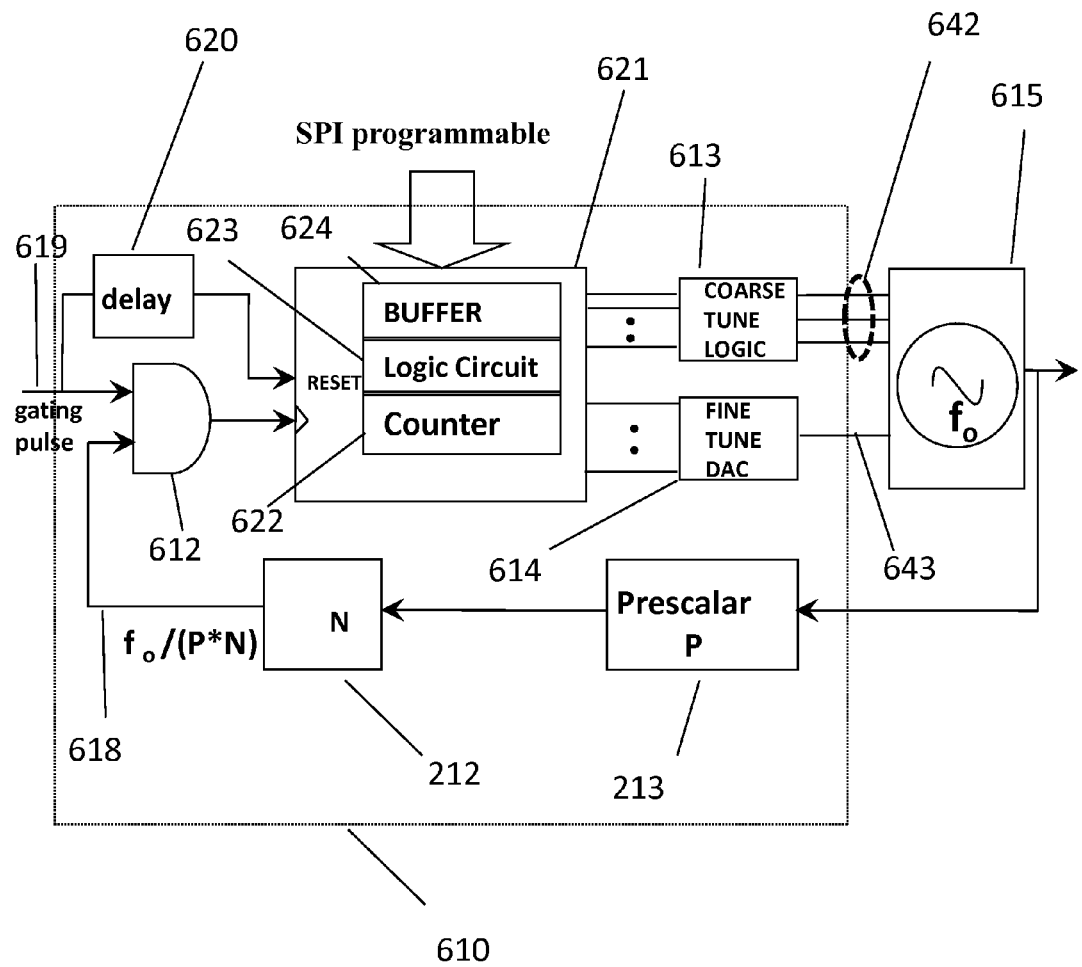
FIG. 6 is a digitally controlled VCO containing coarse-tune lines and a fine-tune DAC circuitry.

FIG. 6 shows a block diagram of a digitally controlled VCO. It utilizes an analog VCO 615 to generate an output signal having a predetermined oscillation frequency (anywhere in the range of 1-100 GHz). A digital control circuit 610 sets the VCO to this desired frequency through control-signals applied to the control-signal input of the VCO. The setting of the VCO frequency needs a gating pulse with a preset or predetermined time interval, Tint (shown in FIG. 7); this pulse is applied at input line 619 in form of a gating pulse.

Digital control circuit 610 comprises a Prescalar unit 213 for dividing high frequency by a factor P. A digital divider 212 further divides the frequency for use in digital logic circuits by another factor N. An AND logic-gate 612 logically ANDs its two input signals. A delay circuit 620 provides a time delay so as to provide appropriate time, e.g., 10 ns, for circuit to respond. A counter-logic circuit 621 counts and compares the resultant count to a stored count value. A fine-tune Digital-to-Analog Converter (DAC) 614 generates an analog voltage from the digital bits it receives. It's called fine tune because it provides small step adjustments in frequency. Finally a coarse-tune logic circuit 613, implemented using switched capacitors, is used to coarsely tune the frequency of the VCO. Counter-logic circuit 621 further includes a digital counter 622 that counts its input pulses. A buffer 624 stores the value that is used for comparing. A logic circuit 623 compares stored value in the buffer to the counter count. The logic circuit is similar to a numerical subtraction circuit. It results in an output that indicates how far the counter count is compared to the stored value and whether it is more or less compared to the stored value.

As is known in the art, in a VCO containing an inductor and a capacitor, the output frequency is determined by the values of these components. To provide a large oscillation range a switched capacitor bank, that contains numerous capacitors, is used in the VCO. The digital signal from counter-logic circuit 621 is conditioned by the coarse-tune logic circuit 613 to and supplied to the VCO through the coarse-tune signal 642 through a set of bits. In the embodiment of FIG. 6, the three coarse-tune signal lines represent three separate bits used to select capacitors from the VCO capacitor bank. Coarse-tune logic circuit 613 thereby generates large movements in frequency and is used for coarse VCO frequency adjustments.

Fine-tune DAC 614 is used to further adjust the VCO frequency after the coarse tune is set or latched. The digital signal from counter logic 621 is utilized by the fine-tune DAC 614 to generate an analog voltage on the fine-tune signal line 643. The coarse-tune signal 642 and fine-tune signal 643 are collectively called control-signals for the VCO.

Digital counter 622 is usually a digital circuit that is known in the art. In its simplest form, the counter is implemented using flip-flops when the divide ratio is $2^N$. Circuit block 213 is a high-speed frequency divider circuit and is also referred to as a prescalar because of the high frequency of operation. The prescalar divides the frequency of the VCO by integer value P. Divider 212 further divides the VCO's frequency by another integer value N. This divided frequency is fed back on line 618 into AND gate 612. When a gating pulse is present on line 619, the AND gate enables counter 622 to count the pulses and the divided VCO signal.

FIG. 7

Gating Pulse

Figure 7:
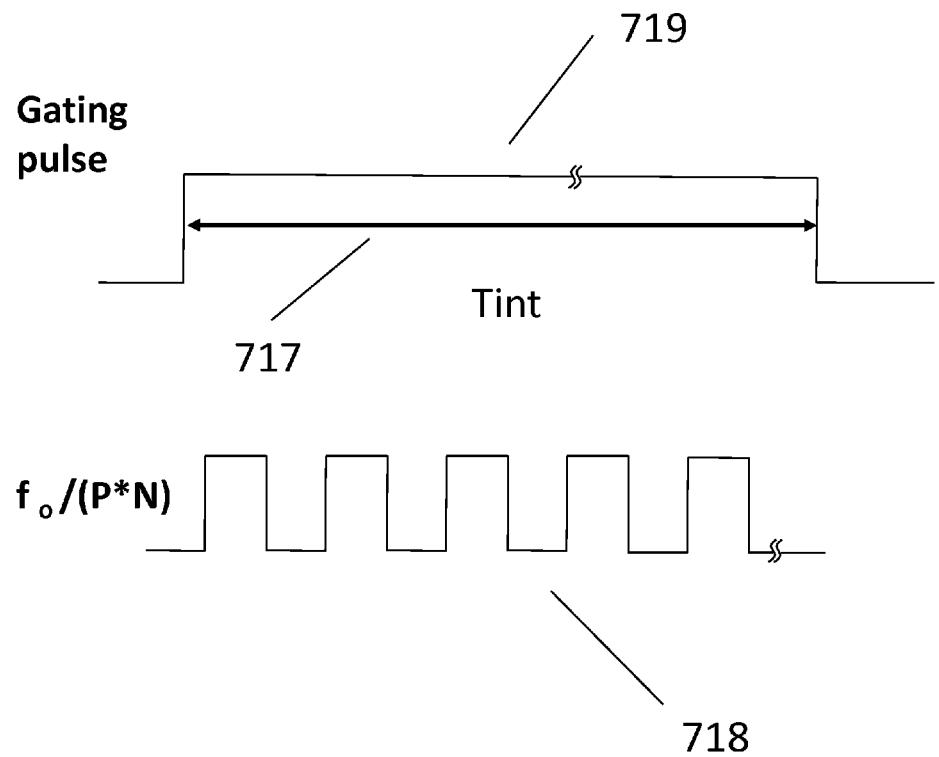
FIG. 7 shows gating pulse generated by the external control circuit of FIG. 5.

FIG. 7 shows a picture of a typical gating pulse 719. It has a high value for Tint duration 717. During this duration the divided signal from VCO 718 goes into the counter and is counted. This gating pulse is an input for AND gate 612 of FIG. 6.

FIG. 6

VCO Operation

The digitally controlled VCO of FIG. 6 operates as follows: Assume that the required center frequency for the VCO is 30.25 GHz. Also let P=32 ($2^5$) and N=512 ($2^9$). The divided VCO frequency at input 618 of AND gate is calculated to 1.846313 MHz. If the gating pulse is 1 ms wide, then counter 622 will count 1846 pulses during the time interval of the gating pulse. However, since the VCO frequencies can vary depending upon the process and temperature, the resultant counter count can vary. Thus, the count in the predetermined time interval reflects the VCO frequency. The counter, therefore, has a unique counter state for any given VCO frequency. Our goal is to center the VCO frequency to the required oscillation frequency of 30.25 GHz, thereby making the counter count to the desired value of 1846. This is also referred to as the desired state of the counter. This desired counter value is stored in buffer 624 by either programming the buffer by external means or by hardwiring the buffer to the desired value. Hardwiring is achieved by setting each bit of the desired counter value through the supply or the ground voltage through a wire connection. Logic circuit 623 compares the counter unique state to the stored desired state in buffer 624. Based on this comparison, digital control bits are generated. The digital control bits reflect the difference between the values. For example when the count is same all digital control bits may be set to zero. On the other hand when the stored count is more, the digital control bits could be the integer difference in binary; and so on. The digital control bits generate control-signals 643 and 642 to change the frequency of the VCO. Control-signals 643 and 642 are the output signals from fine-tune DAC 614 and coarse-tune logic circuit 613, respectively.

As counter 622 counts, its state changes. Such a counter has as many states as it can count and thus represent a multi-state system. The divided VCO frequency serves as a clock for the counter and triggers the counter to count. After a predetermined time interval, Tint, the counter attains a state, referred to as a unique state. In other words counter represents a multiple-state system that attains a unique state in predetermined time interval based on divided VCO frequency.

Now assume that due to a process variation, the VCO frequency is 31 GHz instead of the desired 31.25 GHz. As a result, the counter's count will increase to a unique value of 31.25 GHz/(32×512)=1892, differing from the desired value of 1846. The logic circuit compares the counter count value of 1896 to the desired count of 1846 stored in buffer 624. Based on this comparison the logic circuit will modify control-signals 642 and 643. The modification of the control signals is done based on number of different criteria, such as the rate of change of frequency with voltage and how far is the VCO from the desired frequency.

In any case the logic circuit will sense that the frequency is too high. It will then change the control-signal so as to force the VCO to a lower frequency. This in turn will result in lower counter count, moving it toward the desire value of 1846. Thus the multi-state system is forced toward the desired state. This feedback mechanism takes the VCO frequency, determines the unique state of the multi-state system, compares it with a desired state, and then re-adjusts the VCO frequency to center the frequency.

The amount that the frequency adjusts is dependent upon the gain of the feedback. Depending upon the designed feedback gain, the lowered VCO frequency may result in a counter count of less than the desired value 1846. In other words the frequency has been lowered too far. A comparison of this lower value with 1846 will drive the VCO frequency to be higher in the next correction cycle. During this process it may oscillate around the desired state of 1846. Eventually the steady state solution of 1846 is attained. For another feedback gain setting, the decrease to 1846 can be monotonic or always decreasing; and thereby be gradual.

Logic circuit 623 may contain a latch that determines the state of fine tune DAC 614 and coarse-tune logic circuit 613 at the end of each gating pulse. The next state of the DAC and the coarse-tune logic circuit is a function of the unique counter count when compared to the desired state. Counter 622 will need to be reset after each gating pulse since after each gating pulse the counting needs to restart. The falling edge after an appropriate delay in delay circuit 620 can be used to reset the counter. It will thus take a few gating pulses for the counter to reach the desired state and achieve equilibrium. The number of gating pulses required to achieve the desired state is subject to detailed design of the circuit blocks. Clearly based on the above there are several ways in which the logic can be implemented.

Similarly, with the VCO at a lower frequency, the counter, together with the control-signals, will force the frequency to increase until equilibrium is reached. This will calibrate the VCO. Once equilibrium is achieved, the gating pulse can be completely removed as the logic circuits that determine the DAC and coarse-tune logic state can hold the last known value. Under these conditions the no counting is occurring and the gating signal is off. However, often due to temperature and aging frequencies of the VCO can drift. This would result in a drifting VCO. To mitigate this effect, the source can be periodically recalibrated as previously mentioned to overcome drift.

Moreover, the gating pulse may not be periodic nor does it have to be continuous. This also eliminates reference-frequency-related spurious content from the transmitted output. Another advantage of the present embodiment is that once the desired frequency is attained, the prescalar unit, counter, and external gating pulse generating circuits can be turned off while maintaining a constant control voltage. This results in a fairly constant frequency. In addition lower power consumption is achieved over prior-art sources as a phase-frequency detector and a charge pump are not needed. With the VCO being primarily controlled digitally, the loop is more immune to noise than prior-art circuits. The frequency of the source can be modified by either changing the desired state, the divider count N, or the width of the gating pulse. These changes can be made together or independent of each other.

The maximum frequency error is a function of the counter, the time interval Tint of the pulse, and the DAC's resolution. Let us consider the DAC first. Assume that the DAC has a resolution of 12 bits, which is equivalent to 4096 (2'12) states and the VCO tuning range is 3 GHz. Then the frequency resolution is 732 KHz. The frequency setting error then will be approximately ±366 KHz. On the other hand the error due to Tint and the counter is more complicated. Clearly if Tint is very long, and the counter is able to count the pulses, then because of the large number of cycles counted, accuracy is improved. On the other hand if Tint is small, the error will look bigger. In a typical design the total frequency error due can be as much as ±2 MHz.

FIG. 8

Alternative Embodiment

Figure 8:
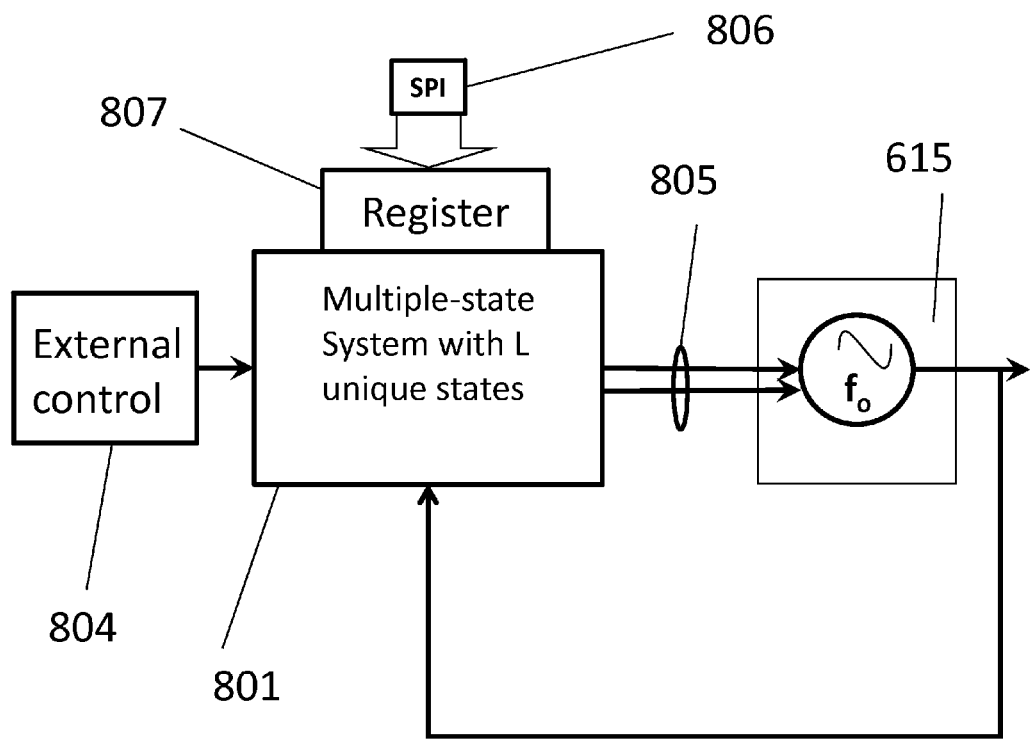
FIG. 8 shows a VCO controlled digitally through a state machine.

FIG. 8 shows an alternative frequency source that can be used for the communication system of FIG. 3. The components shown in FIG. 8 could now replace components 301 and 302 of FIG. 3A. FIG. 8 comprises a multiple-state system 801 used to generate a unique state, a serial-programmable interface (SPI) 806 used for programming a register 807 that stores the desired state, a set of control-signals 805 used to control a VCO 615, and an external control 804 used for determining the unique state of the multiple-state system. The multiple-state system can be realized by electrical circuits, including but not limited to counters, memory circuits or latches. For example in FIG. 6, counter 622 represent the multiple-state machine. Multiple-state system 801 has L unique states, where L in general is a whole number. The possible frequencies from voltage-controlled oscillator 615 are subdivided into frequency groups and each frequency group is mapped into one of the L unique states. For given frequency of the VCO, there is a unique state for out of the L unique states. After the unique state is set by the VCO, an external control 804 is used to compare the set unique state with a desired state. An external control 804 may comprised a control circuit, such as programmable microprocessor, that generates gating pulse or just time markers. If there is a difference between the unique state and the desired state, the frequency of VCO is adjusted by adjusting the control-signals 805. The VCO is thereby adjusted so that it generates the desirable state in that multiple-state system. Multiple-state system 801 and external control 804 can also be implemented in a microcontroller.

FIG. 9

Another Embodiment

Figure 9:
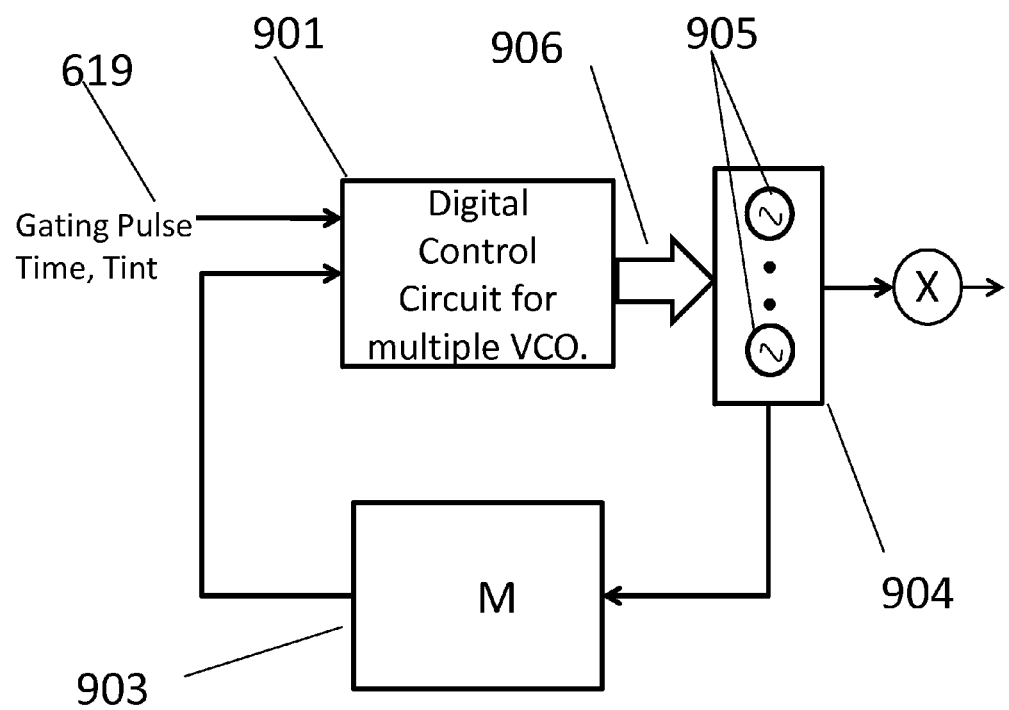
FIG. 9 shows multiple VCOs being controlled digitally for increased output frequency range.

FIG. 9 shows an alternative frequency source that can be used for the communication system of FIG. 3. The components shown in FIG. 9 could now replace components 301 and 302 of FIG. 3A. A frequency source 904 comprises a multiple VCOs 905, each tuned to a different center frequency. This results in a very large tuning range. Control-signals 906 are generated by a digital control circuit for multiple VCO 901. Control-signals 906 select the required voltage-controlled oscillator from the multiple VCOs 905, and generates the aforementioned coarse-tune bits and DAC values for the selected VCO. A divider circuit 903 is used to divide the frequency of source 904 and the frequency-divided signal is fed into the digital control circuit for multiple VCO 901. The frequency-divided signal and the gating pulses 619 are needed by digital control circuit for multiple VCO 901 to generate control-signals 906. The functionality of this embodiment is similar to that of the system of FIG. 8 and is not repeated.

CONCLUSIONS, RAMIFICATIONS, AND SCOPE

A low-cost, power-efficient communication system has been discussed. Power consumption is lowered by digitally controlling the frequency source. This can be used with non-coherent modulation for MMWWBB communication systems. Power consumed can be lowered over prior-art circuits as most of the digital controlling circuitry can be switched off after frequency centering. Further cost reduction is possible when most of the digital controlling circuitry is implemented in a microcontroller. The synthesizer can be made using digital components and the demodulation is achieved through simple methods. Since, the communication system is made simpler; the cost of each component is further reduced. Since the controlling signal can be removed, the communication system also eliminates reference-frequency-related spurious content from the transmitted output.

While the above description contains many specificities, these should not be construed as limitations on the scope of the invention, but as exemplifications of some present embodiments thereof. Many other ramifications and variations are possible within the teachings of the invention. For example, the VCO can be replaced by a ring-oscillator whose oscillation frequency is changed by changing the time-delay. In addition, division can be achieved through sub-harmonic resonance or injection locking The preset time-interval may be generated from another harmonic signal, etc. The values of components, frequencies, voltage levels, etc can be adjusted or changed.

Accordingly, the scope of the present systems and embodiments should be interpreted according to the scope of the following claims and their legal equivalents and not by the examples given.

The invention claimed is:

1. A communication system for millimeter-wave wide-bandwidth bands comprising
   (a) a transmitter having a source and comprising:
      (i) a voltage-controlled oscillator arranged to generate an output signal having a oscillation frequency,
      (ii) said voltage-controlled oscillator having at least one control-signal input, said voltage-controlled oscillator being arranged to control said oscillation frequency of said output signal in response to a control-signal supplied to said control-signal input,
      (iii) a circuit means arranged to generate said control-signal,
      (iv) a multiple-state system that can assume a plurality of states and change its state based upon said oscillation frequency,
      (v) a first means for causing said multiple-state system to assume a unique one of said plurality of states in a preset time interval, and
      (vi) a second means for comparing said unique state to a predetermined desired state after it is set to said unique state in said preset time interval and thereby modify said control-signal,
      (vii) a third means for creating a modulated signal for transmitting information utilizing said output signal of said voltage-controlled oscillator,
   (b) a receiver for receiving said modulated signal, and
   (c) a fourth means in said receiver containing for demodulating said modulated signal in a non-coherent manner, whereby said communication system transmits and recovers said information, and said communication system for said millimeter-wave wide-bandwidth bands has reduced power requirements, complexity, and spurious signals.

2. The communication system of claim 1, further including means for periodically calibrating said voltage-controlled oscillator to overcome process, temperature, and aging effects.

3. The communication system of claim 1 wherein said voltage-controlled oscillator comprises a bank of voltage-controlled oscillators.

4. The communication system of claim 1 wherein said control-signal comprises a coarse-tune signal and a fine-tune signal.

5. The communication system of claim 4 wherein said coarse-tune signal comprises a set of bits and further including a coarse-tune logic circuit for generating said set of bits.

6. The communication system of claim 4 wherein said fine-tune signal has a voltage level and further including a digital-to-analog converter for generating said voltage level.

7. The communication system of claim 1 wherein said multiple-state system is selected from the group consisting of a counter, a buffer, a latch, and a microcontroller.

8. The communication system of claim 1, further including means for switching off said multiple-state system after equilibrium is reached.

9. The communication system of claim 1, further including means for switching off said first means and said second means after said source reaches said desired frequency.

10. The communication system of claim 1 wherein said first means is selected from a group of components consisting of a prescalar circuit, a divider, a plurality of flip-flops, a plurality of logic gates, a plurality of digital circuits, and a counter.

11. The communication system of claim 1, further including a means for setting said predetermined desired state by a method selected from the group consisting of programming and hardwiring methods.

12. The communication system of claim 1 wherein said second means comprises a buffer and a logic circuit.

13. The communication system of claim 1 wherein said third means is selected from the group consisting of an on-off keying circuit and a differential binary-phase-shift-keying circuit.

14. The communication system of claim 1, further including means for frequency multiplying said voltage-controlled oscillator's output frequency for generating a signal for said millimeter-wave wide-bandwidth bands.

15. A method for transmission and reception, comprising,
   (a) providing a circuit means comprising at least one voltage-controlled oscillator arranged to generate an oscillation signal,
   (b) providing at least one control-signal means for controlling the frequency of said voltage-controlled oscillator,
   (c) providing a circuit means for generating said control-signal,
   (d) providing a multiple-state system that can assume a plurality of states and changes its state in a preset time interval based upon the frequency of an input signal,
   (e) storing a desired one of said states in a storage means,
   (f) supplying said oscillation signal as said input signal of said multiple-state system, thereby changing the state of said multiple-state system based upon said frequency of said oscillation signal so that said multiple-state system assumes a unique state in said preset time interval by a first means,
   (g) comparing said unique state to said desired state after said preset time interval by a second means,
   (h) modifying said control-signal based on said comparing, whereby said frequency of said oscillation signal is set to a desired frequency,
   (i) modulating said oscillation signal from said voltage controlled oscillator and thereby providing a transmitted signal, and
   (j) detecting said transmitted signal in a receiver in a non-coherent manner,
   whereby said transmission and reception can be used for the millimeter-wave wide-bandwidth bands.

16. The method of claim 15, further including means for periodically calibrating said voltage-controlled oscillator to overcome process, temperature, and aging effects.

17. The method of claim 15 wherein said input-control signal comprises a coarse-tune signal and a fine-tune signal.

18. The method of claim 17 wherein said coarse-tune signal comprises a set of bits and further including a coarse-tune logic circuit for generating said set of bits.

19. The method of claim 17 wherein said fine-tune signal has a voltage level and further including a digital-to-analog converter for generating said voltage level.

20. The method of claim 15 wherein the said multiple-state system is selected from the group consisting of a counter, a buffer, a latch, and a microcontroller.

21. The method of claim 15, further including means for switching off said first means and said second means after said voltage-controlled oscillator reaches said desired frequency.

22. The method of claim 15 wherein said first means is selected from a group of components consisting of a prescalar circuit, a divider, a plurality of flip-flops, a plurality of logic gates, a plurality of digital circuits, and a counter.

23. The method of claim 15, further including a gating pulse with rising and falling edges that occur at differing time, whereby said preset time interval is determined by said rising and said falling edges.

24. The method of claim 23, further including a means for turning off said gating pulse.

25. The method of claim 15 wherein said modulated signal is a keying approach selected from the group consisting of an on-off keying circuit and a differential binary-phase-shift-keying circuit.

* * * * *